(12) United States Patent
Reinmuth et al.

(10) Patent No.: US 8,741,774 B2
(45) Date of Patent: Jun. 3, 2014

(54) METHOD FOR PRODUCING AN ELECTRICAL FEEDTHROUGH IN A SUBSTRATE, AND A SUBSTRATE HAVING AN ELECTRICAL FEEDTHROUGH

(71) Applicants: Jochen Reinmuth, Reutlingen (DE); Yvonne Bergmann, Reutlingen (DE)

(72) Inventors: Jochen Reinmuth, Reutlingen (DE); Yvonne Bergmann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/659,030

(22) Filed: Oct. 24, 2012

(65) Prior Publication Data

US 2013/0099382 A1 Apr. 25, 2013

(30) Foreign Application Priority Data

Oct. 24, 2011 (DE) .......................... 10 2011 085 084

(51) Int. Cl.
*H01L 21/44* (2006.01)
*H01L 21/768* (2006.01)
*H01L 23/48* (2006.01)

(52) U.S. Cl.
CPC ........ *H01L 21/76898* (2013.01); *H01L 23/481* (2013.01)
USPC .......... 438/667; 438/675; 438/666; 257/773; 257/774; 257/E21.576

(58) Field of Classification Search
USPC .......... 438/667, 666, 675, 668; 257/773, 774, 257/E21.576
See application file for complete search history.

(56) References Cited

U.S. PATENT DOCUMENTS

| 8,067,312 B2 * | 11/2011 | Trezza .......................... 438/675 |
| 2010/0164062 A1 * | 7/2010 | Wang et al. .................... 257/532 |
| 2011/0079919 A1 * | 4/2011 | Chaabouni et al. ........... 257/774 |
| 2011/0169169 A1 * | 7/2011 | Reinmuth et al. ............. 257/773 |
| 2012/0112324 A1 * | 5/2012 | Huang .......................... 257/621 |

FOREIGN PATENT DOCUMENTS

| DE | 10 2006 018 027 | 4/2006 |
| DE | 10 2006 042 366 | 3/2008 |

* cited by examiner

*Primary Examiner* — Michael Trinh
(74) *Attorney, Agent, or Firm* — Kenyon & Kenyon LLP

(57) ABSTRACT

A method for producing an electrical feedthrough in a substrate includes: forming a first printed conductor on a first side of a substrate which electrically connects a first contact area of the substrate on the first side; forming a second printed conductor on a second side of a substrate which electrically connects a second contact area of the substrate on the second side; forming an annular trench in the substrate, a substrate punch being formed which extends from the first contact area to the second contact area; and selectively depositing an electrically conductive layer on an inner surface of the annular trench, the substrate punch being coated with an electrically conductive layer and remaining electrically insulated from the surrounding substrate due to the annular trench.

12 Claims, 12 Drawing Sheets

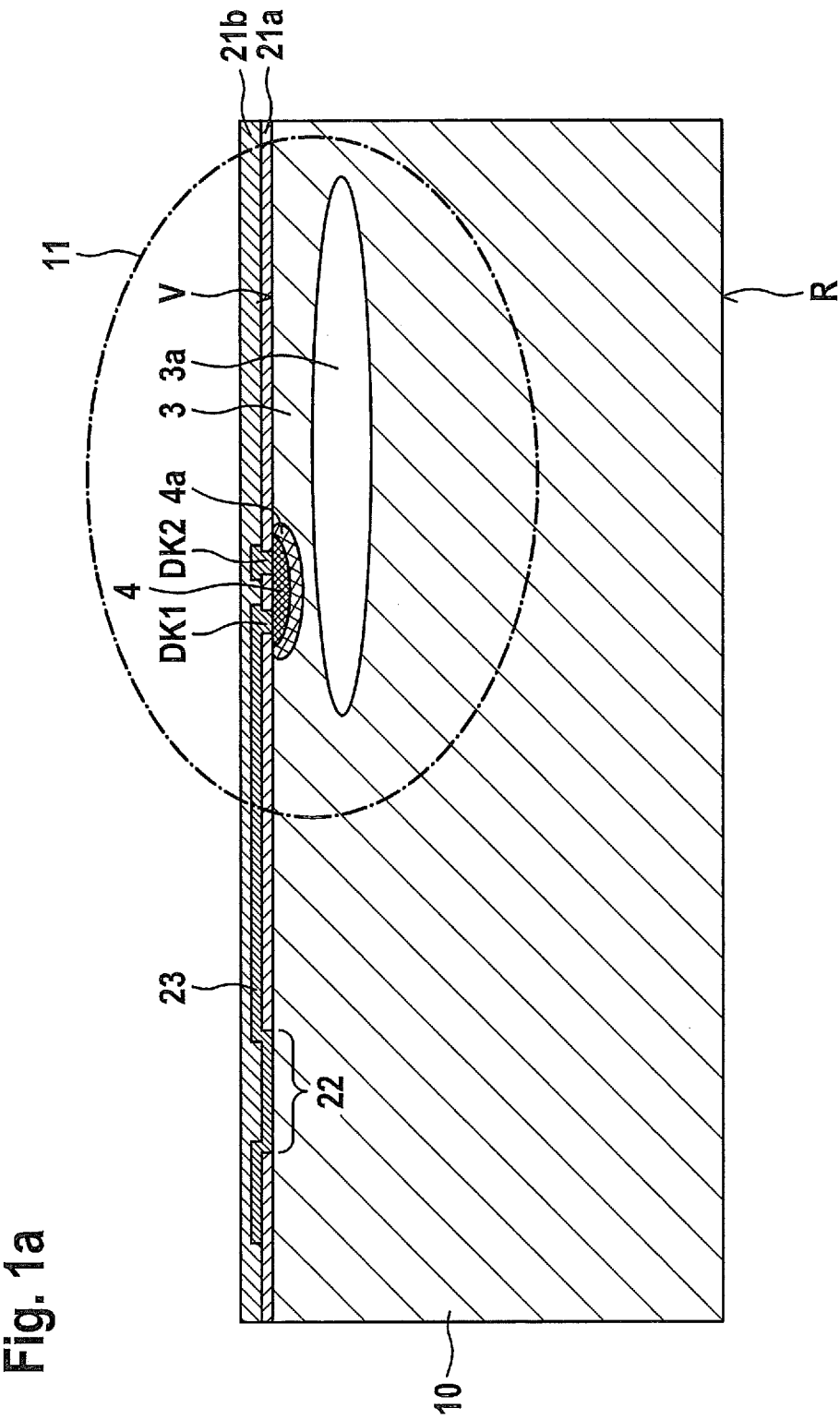

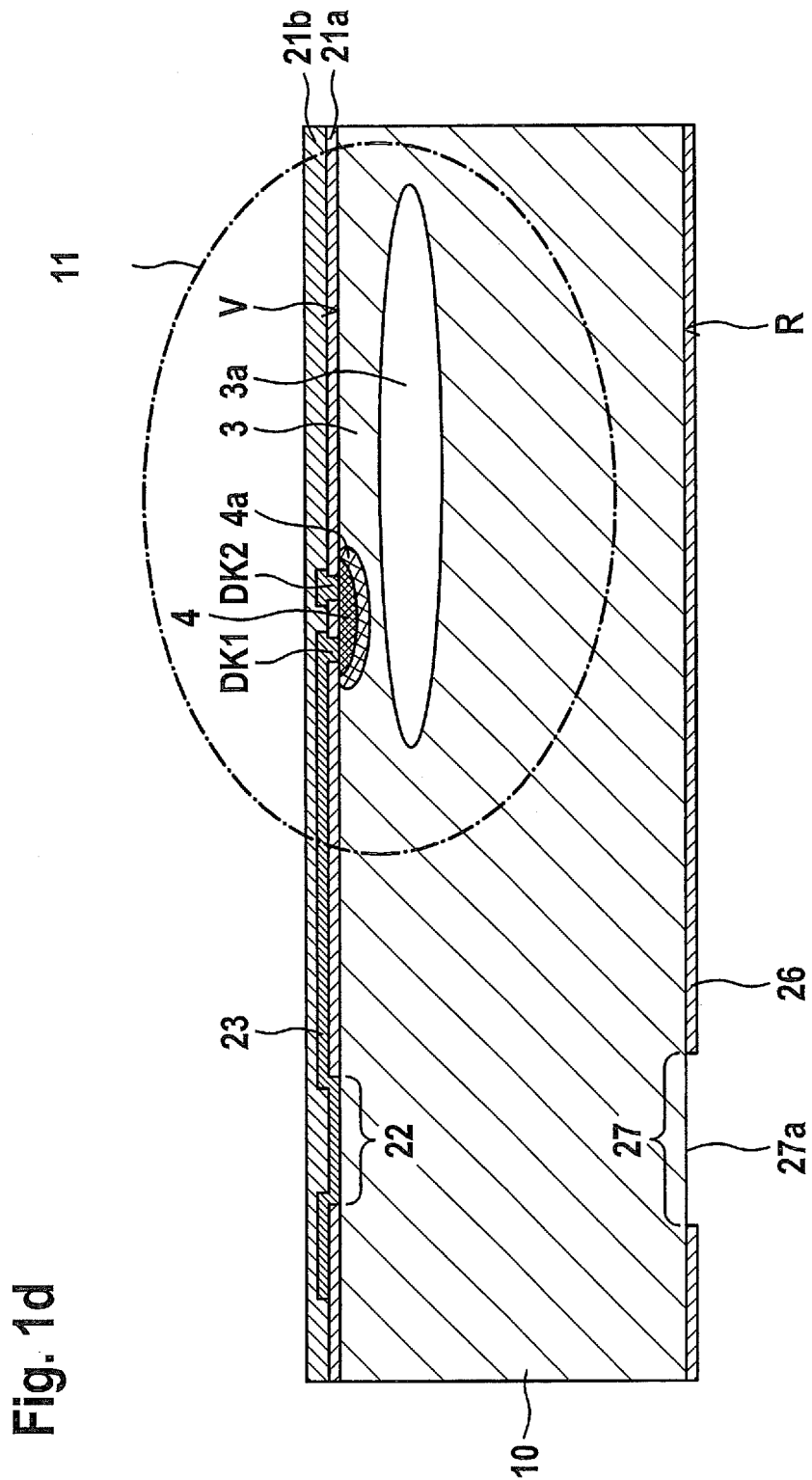

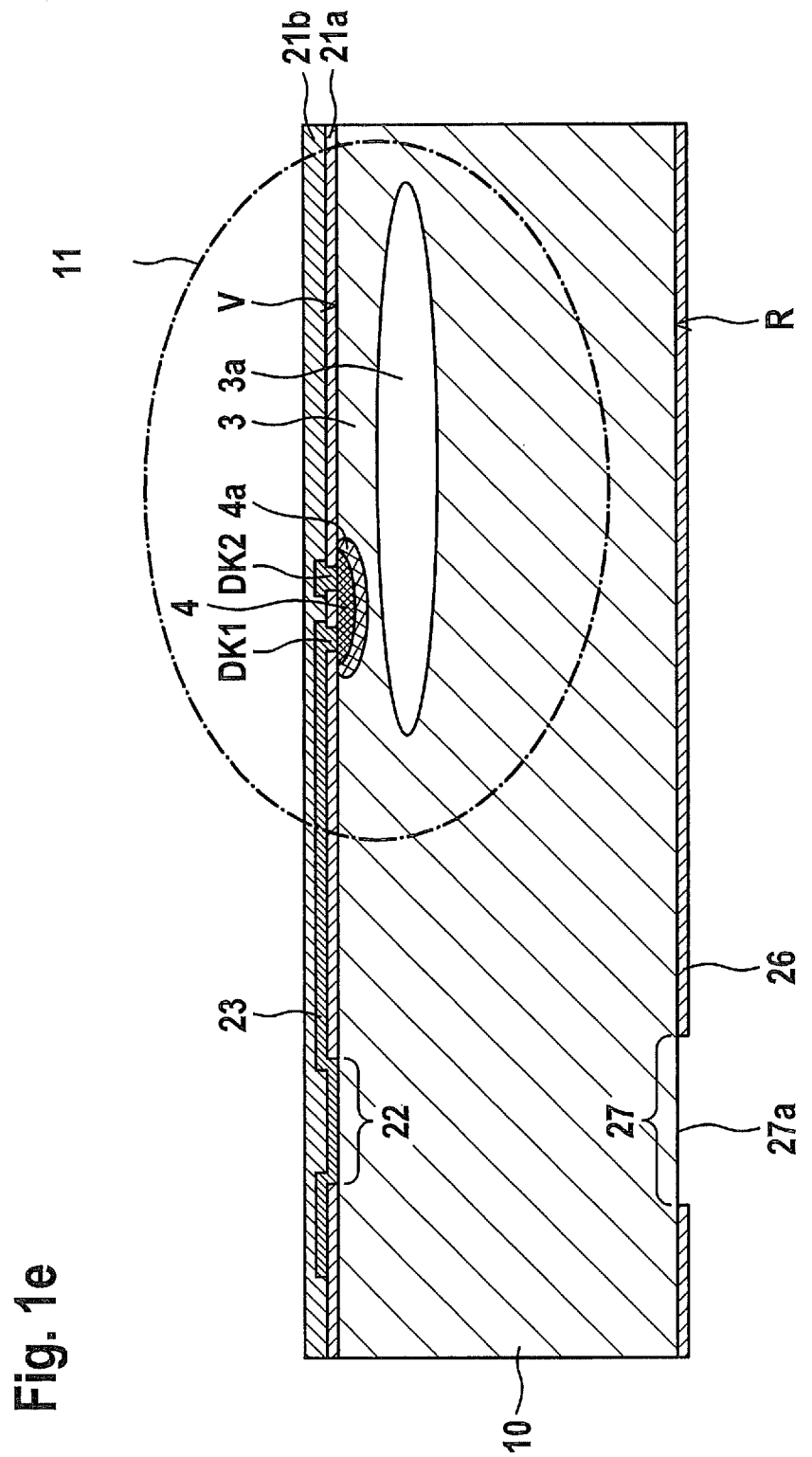

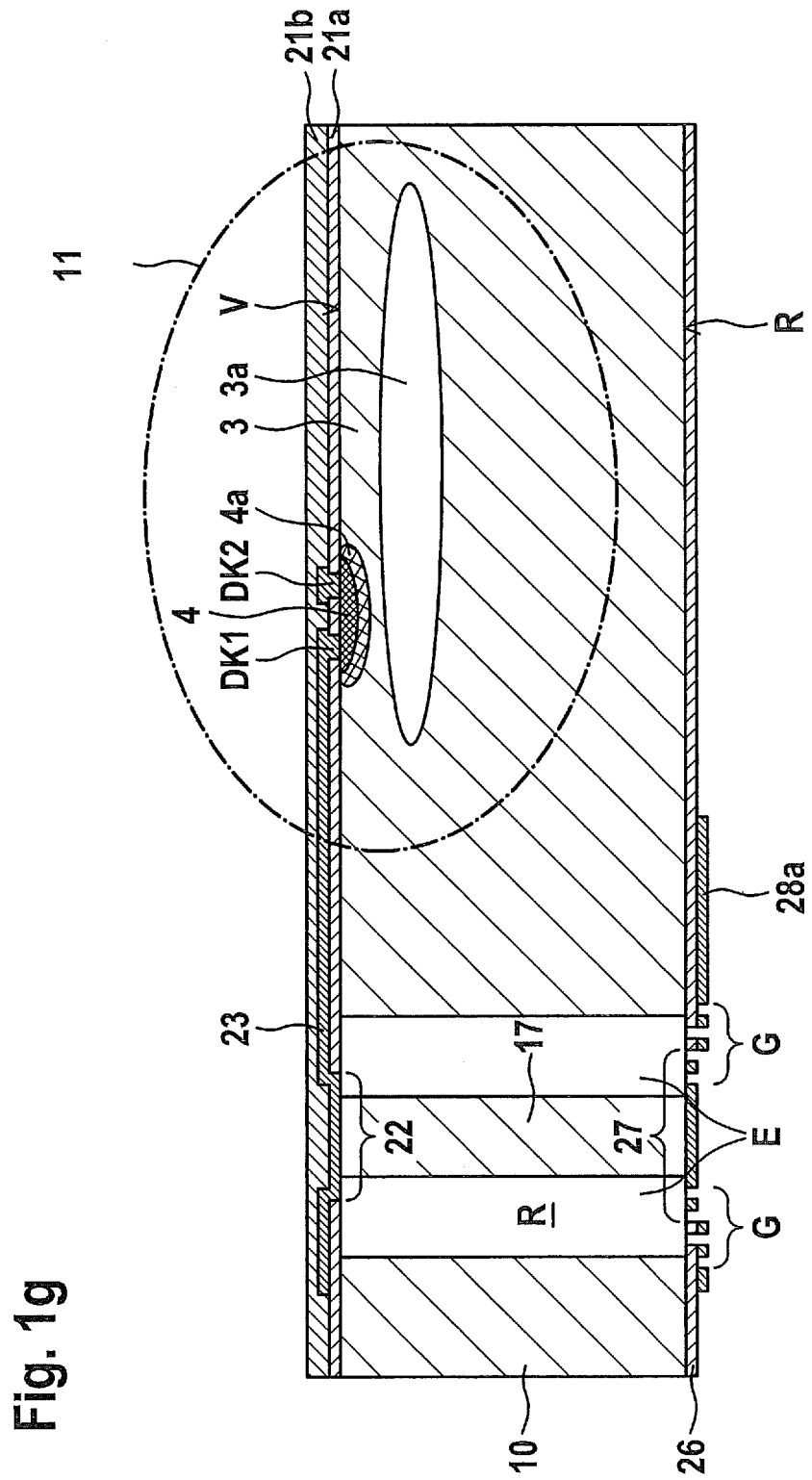

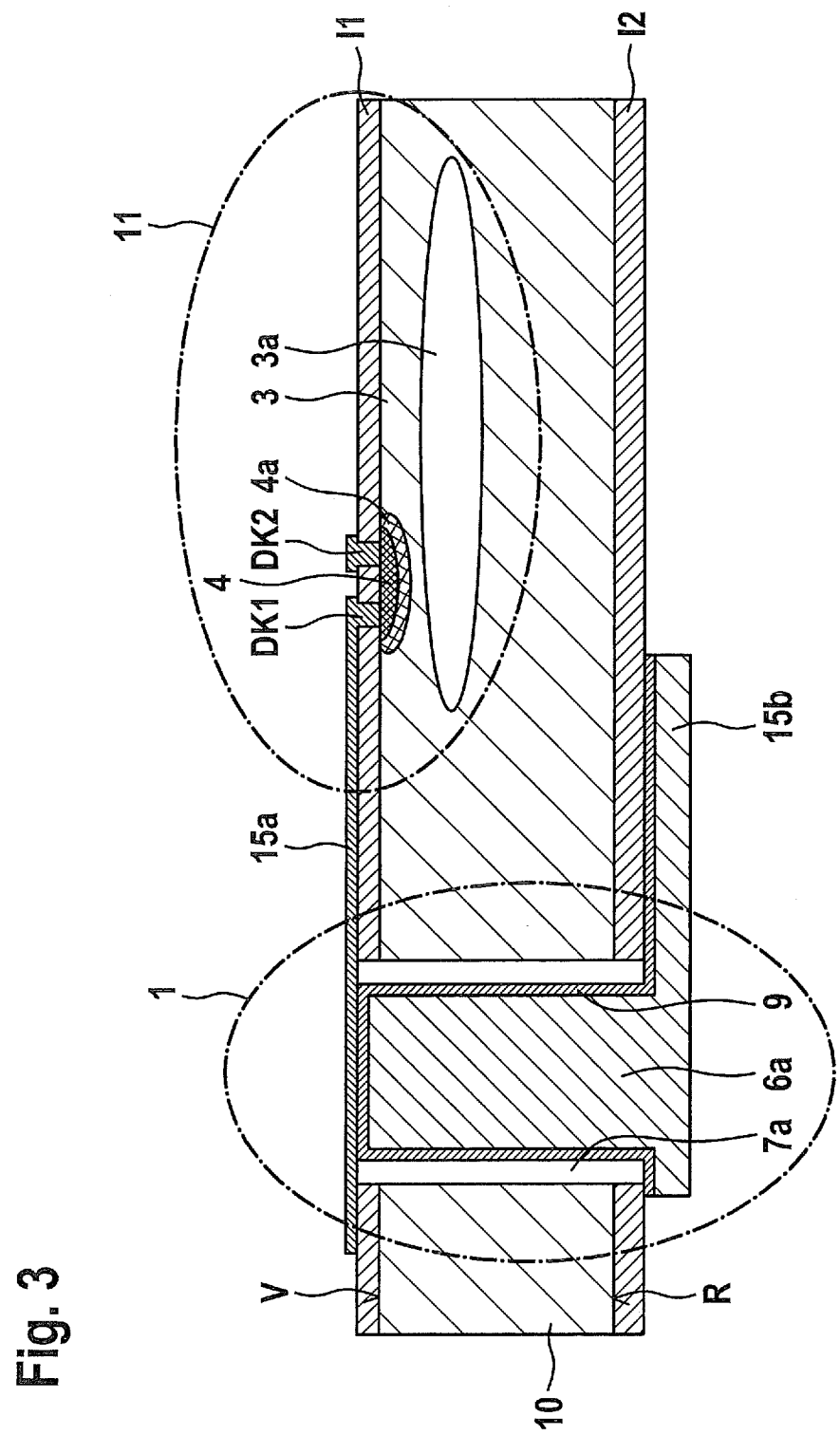

US 8,741,774 B2

METHOD FOR PRODUCING AN ELECTRICAL FEEDTHROUGH IN A SUBSTRATE, AND A SUBSTRATE HAVING AN ELECTRICAL FEEDTHROUGH

BACKGROUND OF THE INVENTION

1. Field of the Invention

The present invention relates to a method for producing an electrical feedthrough in a substrate, and a substrate having an electrical feedthrough.

2. Description of the Related Art

Electrical feedthroughs in a substrate or in a subarea of a substrate, such as a wafer, for example, exist in numerous specific embodiments. The objective is always to achieve the smallest possible feedthrough at a low electrical volume resistance. To achieve this, frequently a narrow through hole having practically vertical walls is produced in the substrate in question, the wall is electrically insulated, and the through hole is then completely or partially filled with a metal or a metal alloy in order to obtain the desired low volume resistance.

Depending on the application, this known approach has limitations. On the one hand, there are applications in which the presence of metal results in interference. The micromechanical pressure sensor is named here as one example of numerous MEMS applications.

FIG. 3 shows a schematic cross-sectional illustration for explaining the object on which the present invention is based, with reference to a substrate having an electrical feedthrough and a pressure sensor as an example.

In FIG. 3, reference numeral 10 denotes a silicon semiconductor substrate. A first area 1 having an electrical feedthrough 6a and a second area 11 having a micromechanical component in the form of a pressure sensor are provided in silicon semiconductor substrate 2. Feedthrough 6a is connected to a first electrical contact terminal DK1 of pressure sensor 11 via a printed conductor 15a on front side V of substrate 10. Pressure sensor 11 has a diaphragm 3 which is provided above a cavity 3a. A piezoresistive resistor 4 and an insulation trough 4a situated therebeneath are diffused into diaphragm 3. First electrical contact terminal DK1 as well as a second electrical contact terminal DK2 contact piezoresistive resistor 4 in such a way that the piezoelectric resistance therebetween is detectable.

A first insulating layer Ii is provided between electrical metal printed conductor 15a and front side V of substrate 10. A second insulating layer 12 is provided between an electrical metal printed conductor 15b on the back side, and back side R of substrate 2. Insulating layers I1 and 12 may be oxide layers, for example. Feedthrough 6a connects printed conductor 15a on the front side to printed conductor 15b on the back side. A wall insulating layer 7a, which is likewise made of an oxide, for example, insulates feedthrough 6a from surrounding substrate 10. Lastly, reference numeral 9 denotes a so-called seed layer for applying the metal of feedthrough 6a, which at the same time may be used as a diffusion barrier.

In such classical micromechanical pressure sensors 11, deformation of silicon diaphragm 3, which is situated on silicon substrate 10, is measured via the piezoresistive resistor. The deformation of diaphragm 3, and thus the resistance signal of piezoresistive resistor 4, changes when the pressure changes. As a result of the different material parameters of silicon and metal, narrow metal printed conductors 15a located at the surface and in the vicinity of diaphragm 3 result in voltages which are transmitted via substrate 10 to diaphragm 3. The temperature-dependent portion of the voltages may be compensated for, with some effort. However, the inelastic properties of many metals also result in hysteresis in the characteristic curve of the pressure sensor. It is not possible to compensate for this effect. When metallic areas are provided not only at the surface but also at a depth in substrate 2, even greater adverse effects on voltage-sensitive components, for example such as pressure sensors, are expected.

On the other hand, there are a number of applications in which primarily also high voltages or also only high voltage peaks (ESD, for example) are to be conducted by a substrate or a subarea of the substrate via an electrical feedthrough. This is difficult using the approach described above. The etched through holes are usually insulated by oxide deposition. The achievable oxide thicknesses are greatly limited by the process control and the specific geometry. Therefore, the maximum electric strength is also greatly limited. In addition, the surface of the through holes, which are produced using a trench etching process or a laser process, is rather rough. This roughness causes electrical field peaks which likewise reduce the electric strength.

Alternative approaches without metals are not feasible in many applications, since the extremely low volume resistances which are often necessary are achievable only using metals.

A micromechanical component having wafer through-contacting as well as a corresponding manufacturing method are known from published German patent application document DE 10 2006 018 027 A1. A blind hole is introduced into the front side of a semiconductor substrate using a trench etching process, and the side wall of the blind hole is porously etched using an electrochemical etching process. The blind hole is filled with a metal plating and subsequently opened by thinning the semiconductor substrate on the back side.

A micromechanical component having wafer through-contacting as well as a corresponding manufacturing method are known from published German patent application document DE 10 2006 042 366 A1, in which metallic material is initially applied to a first area on the surface of the top side of a semiconductor substrate. The first area is designed in such a way that it leaves open a second area on the top side of the semiconductor substrate, which does not have the metallic material, and completely encloses this second area. A thermal step is then carried out which produces a first volume area within the semiconductor substrate having P+ or P++ doping. The thermal step results in a diffusion process in which metallic material diffuses from the top side to the bottom side of the semiconductor substrate. As a result of the diffusion process, the first volume area thus produced encloses a second volume area, which is preferably composed of the unaffected P-doped semiconductor material. To provide electrical insulation between the second volume area and the P-doped semiconductor material enclosing the first volume area, the first volume area is porosified using a suitable etching process.

German patent application DE 10 2010 039 339.4, which is not deemed a prior art, discloses the combination of a metallic punch as the feedthrough having a wide insulation ring. It is characteristic for this system that low resistances and a high electric strength as well as an efficient strain decoupling may be achieved. However, this approach allows only for relatively large TSVs (through silicon vias) and the manufacturing process is complex and expensive.

BRIEF SUMMARY OF THE INVENTION

The idea underlying the present invention is that an annular trench is formed in the substrate which is formed from a first side of the substrate to an opposing second side of the substrate, the annular trench being coated by an electrically conductive layer, but at the same time remaining electrically insulated from the rest of the surrounding substrate due to the annular trench.

The coated substrate punch thus created connects one contact area, which is connected to a printed conductor, on the first side of the substrate to a contact area, which is connected to a printed conductor, on the second side of the substrate. Preferably, the annular trench is subsequently filled completely or partially with an insulating material. The substrate punch is used as a low-resistance feedthrough due to its conductive coating.

This type of feedthrough has a high electric strength, low leakage currents, low parasitic capacitances, as well as low electrical resistance. The resistance of the feedthrough is not a function of the substrate doping. With the aid of the method according to the present invention, very small feedthroughs having a high aspect ratio may be implemented. Also, feedthroughs may be implemented in very thick layers which have a planar surface.

The manufacturing process is very cost-effective and requires only one-time trenching of the substrate. Diffusion barriers are not required.

A robust process control is possible, it being possible for the process to take place as a via-last process. The maximum temperature may be lower than 400° C. and the process is CMOS compatible.

BRIEF DESCRIPTION OF THE DRAWINGS

FIGS. 1a to 1j show schematic cross-sectional illustrations for explaining various process stages of a method for producing an electrical feedthrough in a substrate according to a first specific embodiment of the present invention.

FIG. 3 shows a schematic cross-sectional illustration for explaining the object on which the present invention is based, with reference to a substrate having an electrical feedthrough and a pressure sensor as an example.

DETAILED DESCRIPTION OF THE INVENTION

Figure 1B:
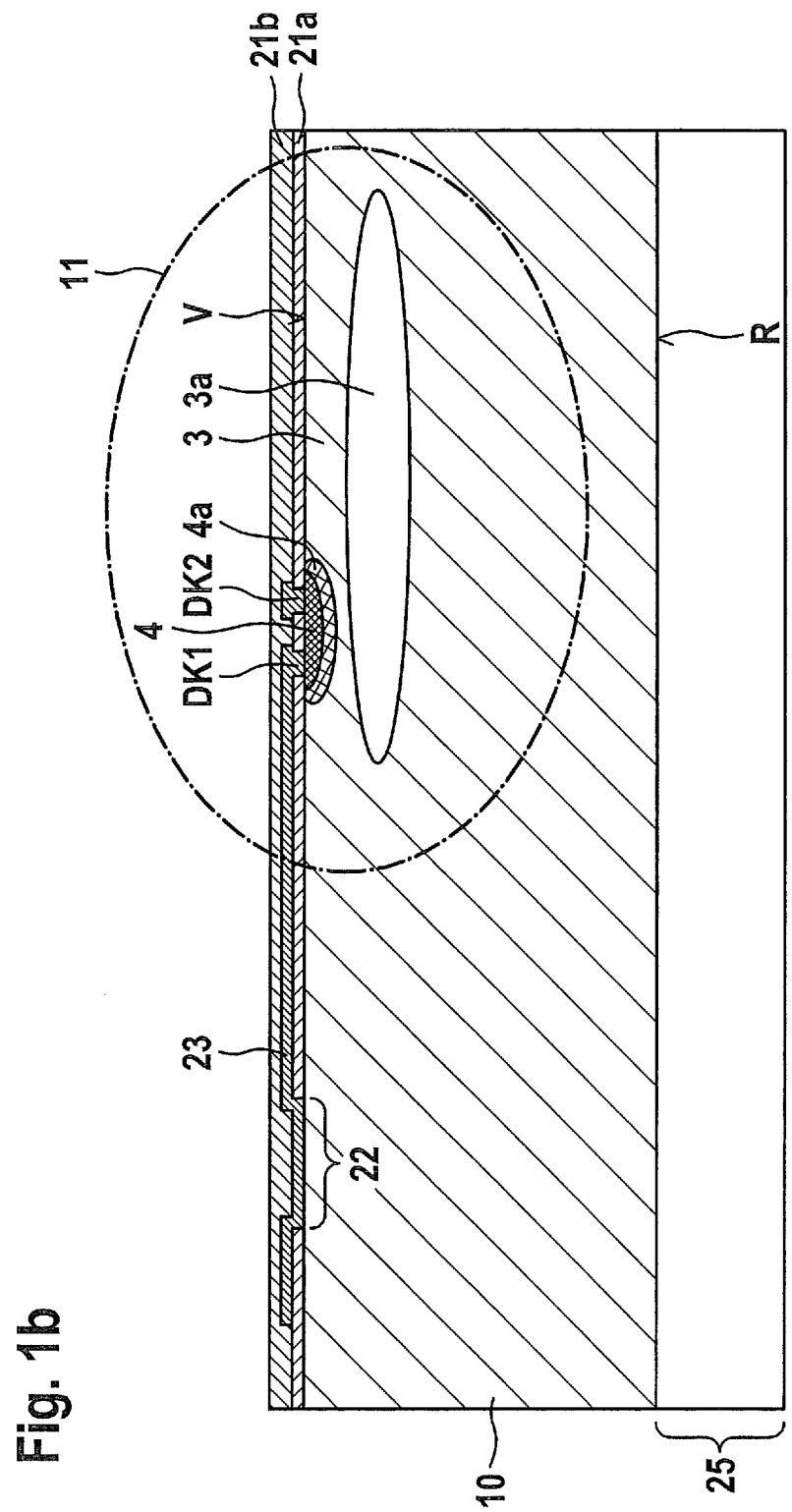

Identical or functionally equivalent components are denoted by the same reference numerals in the figures.

FIGS. 1a through 1j show schematic cross-sectional illustrations for explaining various process stages of a method for producing an electrical feedthrough in a substrate according to a first specific embodiment of the present invention.

According to FIG. 1a, a micromechanical component 11 in the form of a pressure sensor, which has already been explained in detail with reference to FIG. 3, is provided in a silicon semiconductor substrate 10.

After forming a first insulating layer 21a, made of an oxide, for example, on front side V of substrate 10, through holes corresponding to electrical contact terminals DK1, DK2 for piezoresistive resistor 4 as well as a through hole are initially formed in first insulating layer 21a, the through hole defining a contact area 22 of substrate 10 of a feedthrough through substrate 10 which is to be subsequently produced.

Electrical contact terminals DK1, DK2 of piezoresistive resistor 24 and a metallic printed conductor 23 which connects contact area 22 to electrical contact terminal DK1 are subsequently formed by deposition and appropriate structuring of a metal layer.

Another insulating layer 21, made of an oxide, for example, is finally deposited on front side V on top of the electrical circuit configuration.

For printed conductor 23, one or multiple metal layer(s) with or without diffusion barriers or adhesive layers may be deposited. In the exemplary specific embodiment, printed conductor 23 is formed from an aluminum layer.

Furthermore, with regard to FIG. 1b, the substrate is sanded on back side R, an area 25 being removed to reduce the overall thickness of the substrate stack and the height of the feedthrough to be formed. Back side R may be conditioned using a back-etch process in a plasma process or in a liquid etching medium or in a CMP process (chemical mechanical polishing).

Figure 1C:
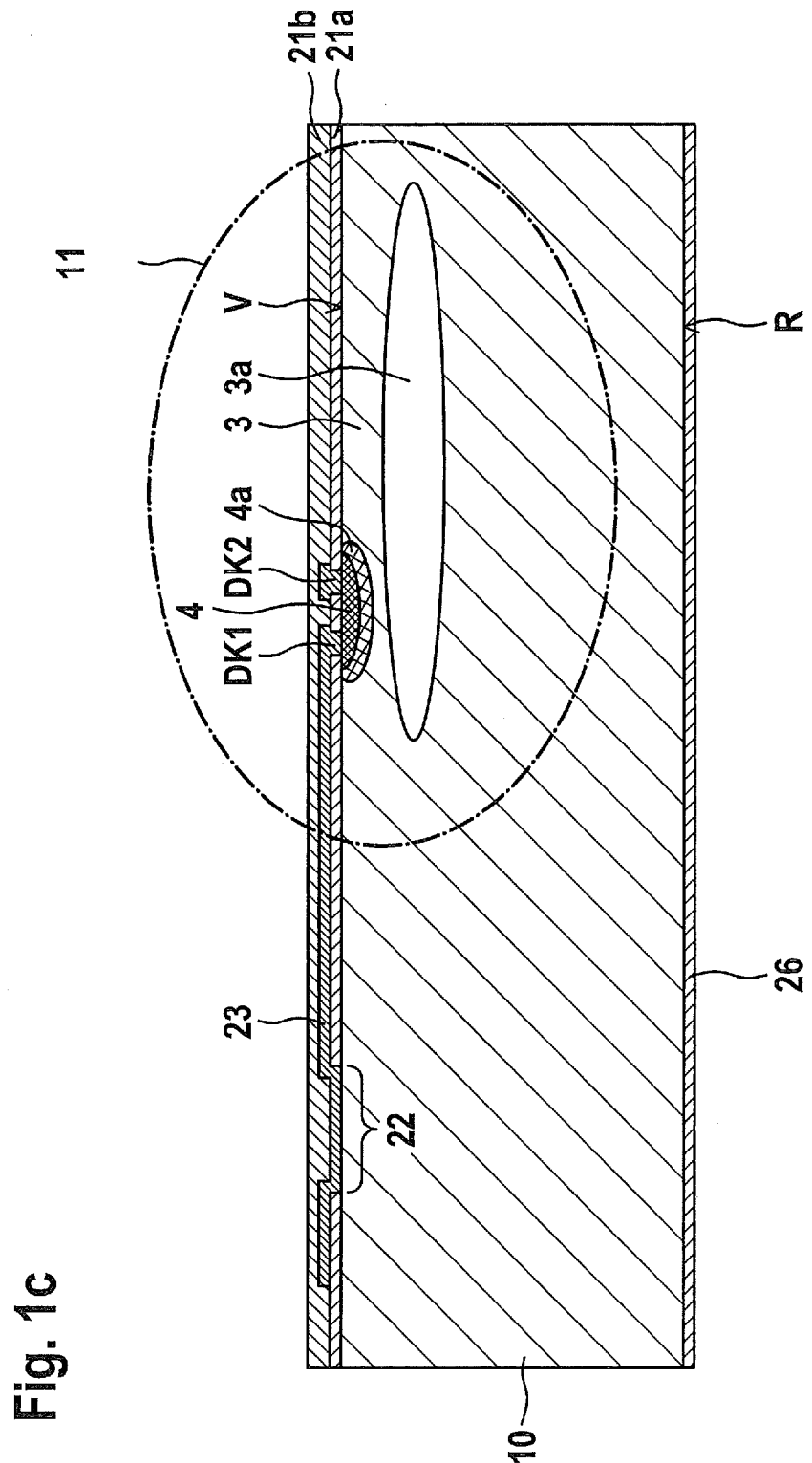

As shown in FIG. 1c, another insulating layer 26, made of an oxide, for example, is deposited on back side R.

As shown in FIG. 1d, a contact hole 27a) is formed in insulating layer 26 to define an additional contact area 27 on back side R which is opposite contact area 22 on the front side.

Similarly to how the front side is processed, a metal plating layer 28a is structured by one or more sublayer(s) with or without diffusion barriers or adhesive layers on top of insulating layer 26 and contact area 27. Thus, metal plating layer 28a electrically connects contact area 27 as shown in FIG. 1e.

Figure 1F:
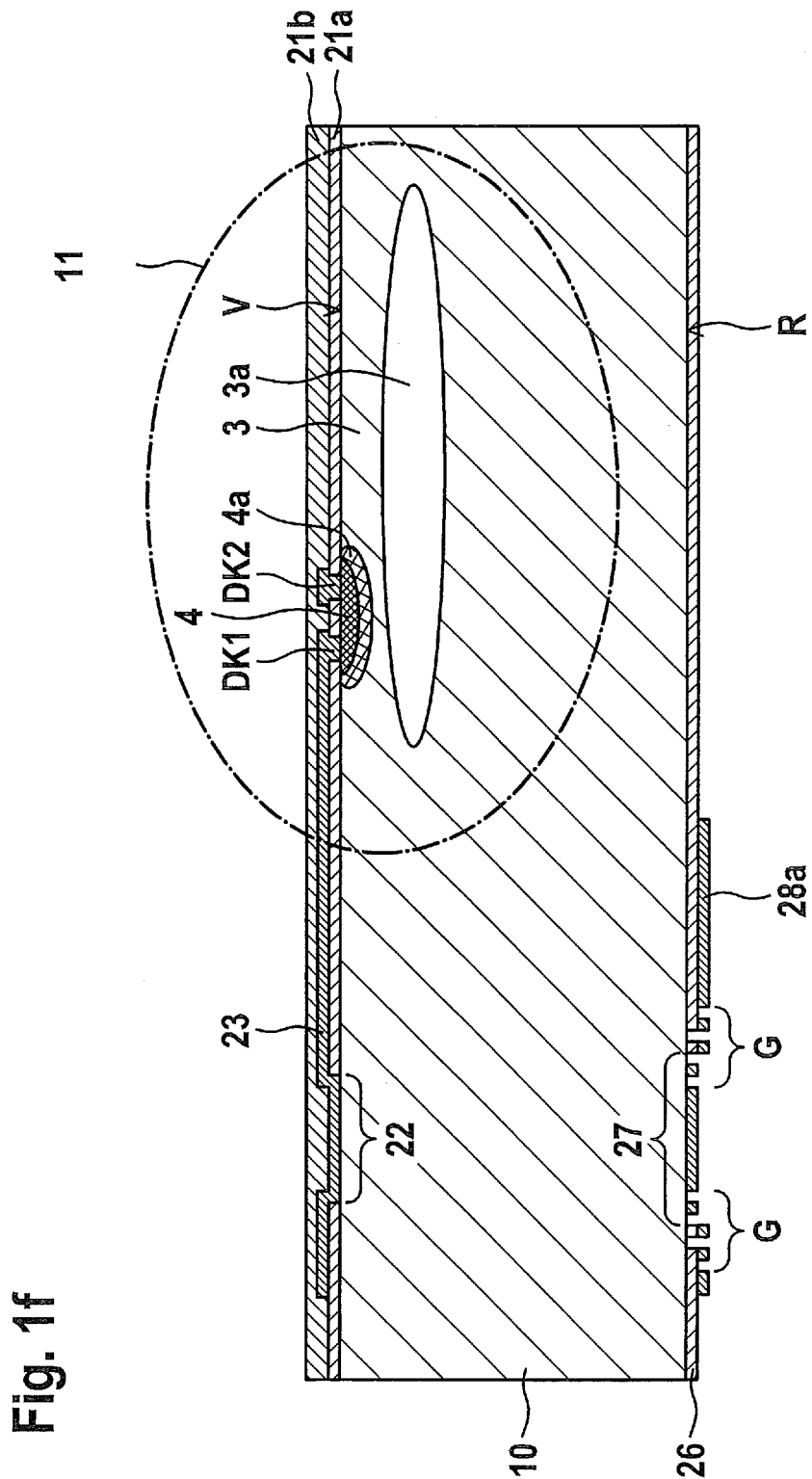

Furthermore, with reference to FIG. 1f, metal plating layer 28a is structured in a printed conductor 28 on the back side, and a lattice G is provided in the process in the area where an annular trench R is to be subsequently formed in substrate 10, the lattice exposing substrate 10 in the area where annular trench R is to be formed. Lattice G in printed conductor 28 is preferably also used in this case as a mask for the perforation of insulating layer 26 lying underneath it.

As shown in FIG. 1g, annular trench R in silicon substrate 10 is formed using a trench etching process during which an etching medium is guided through lattice G to substrate 10, lattice G being completely undercut and a substrate punch 17 being formed which electrically connects contact area 22 on the front side to contact area 27 on the back side. In this case, insulating layer 21a on the front side is used together with printed conductor 23 on the front side as an etch stopping layer.

Figure 1H:
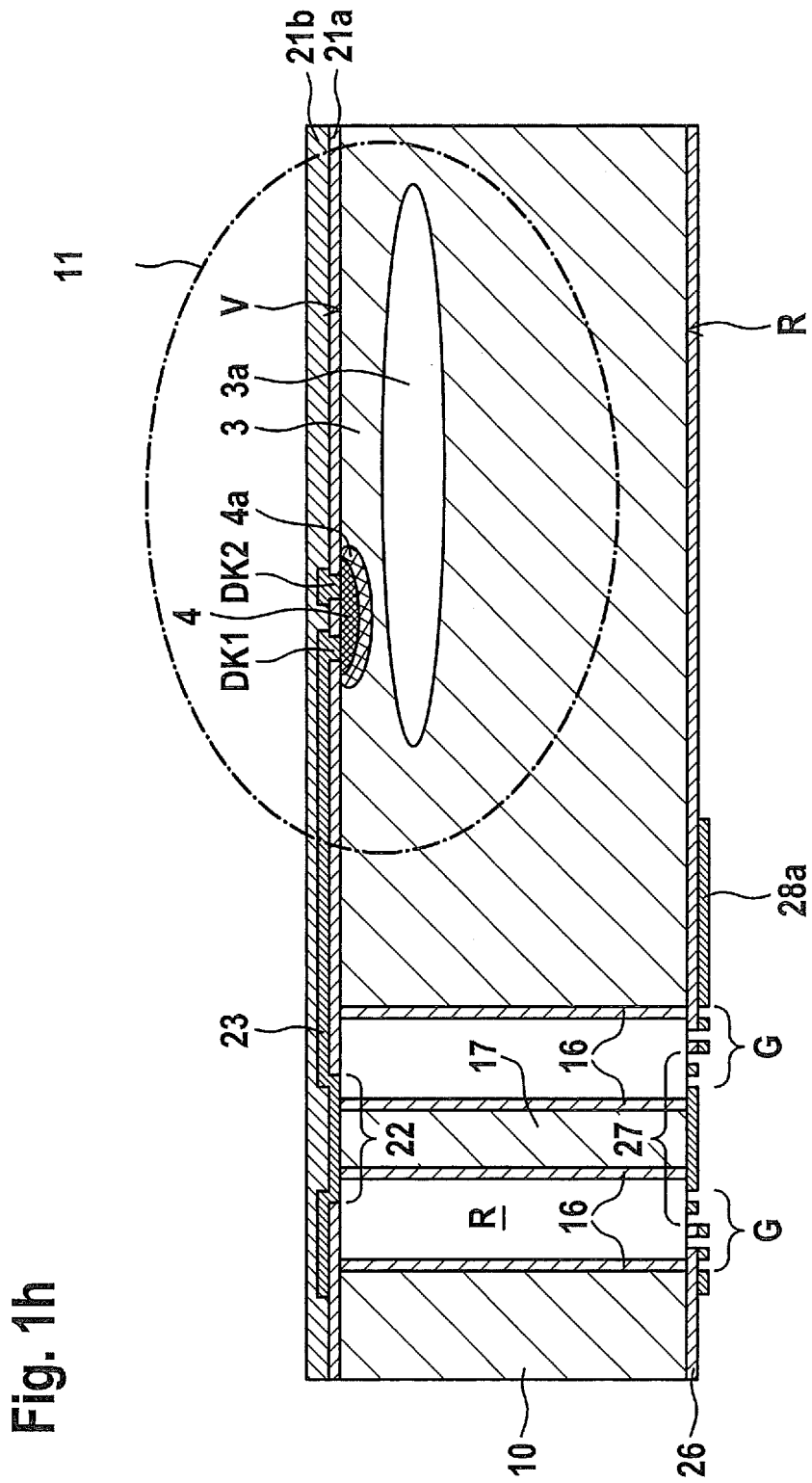

In a subsequent process step, which is illustrated in FIG. 1h, a conductive layer 16, made of tungsten, for example, is deposited in a redox reaction with silicon through lattice G on the vertical trench surfaces of annular trench R in order to make substrate punch 17 low-resistance. Substrate punch 17, which is coated with tungsten layer 16, remains electrically insulated from surrounding substrate 10, since no or hardly any tungsten is deposited on the front side on insulating layer 21a during this selective deposition.

Figure 1I:
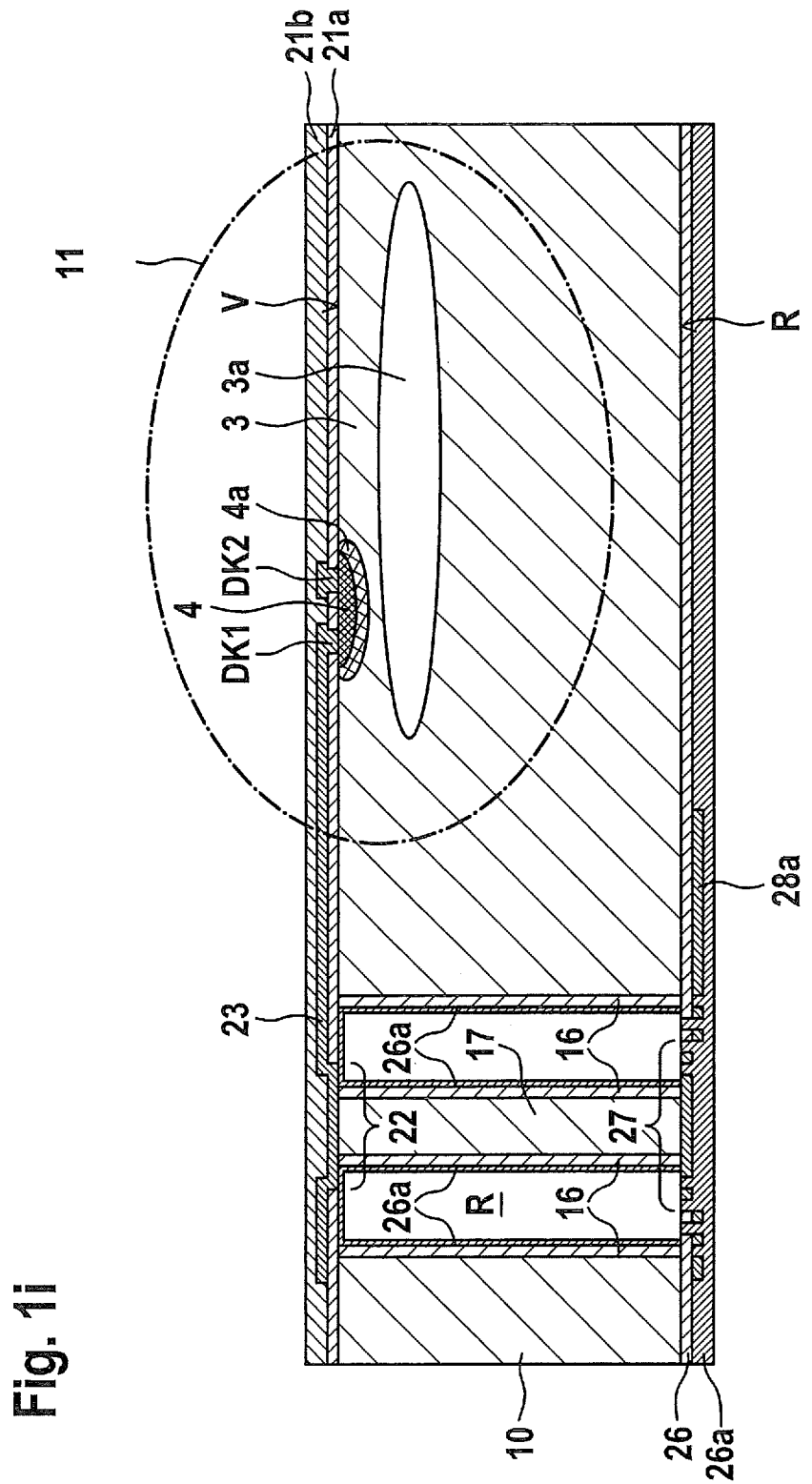

Furthermore, with reference to FIG. 1i, another insulating layer 26a, made of a nitride or an oxide, is subsequently deposited on back side R in order to close lattice G and to passivate the walls of annular trench R.

Figure 1J:
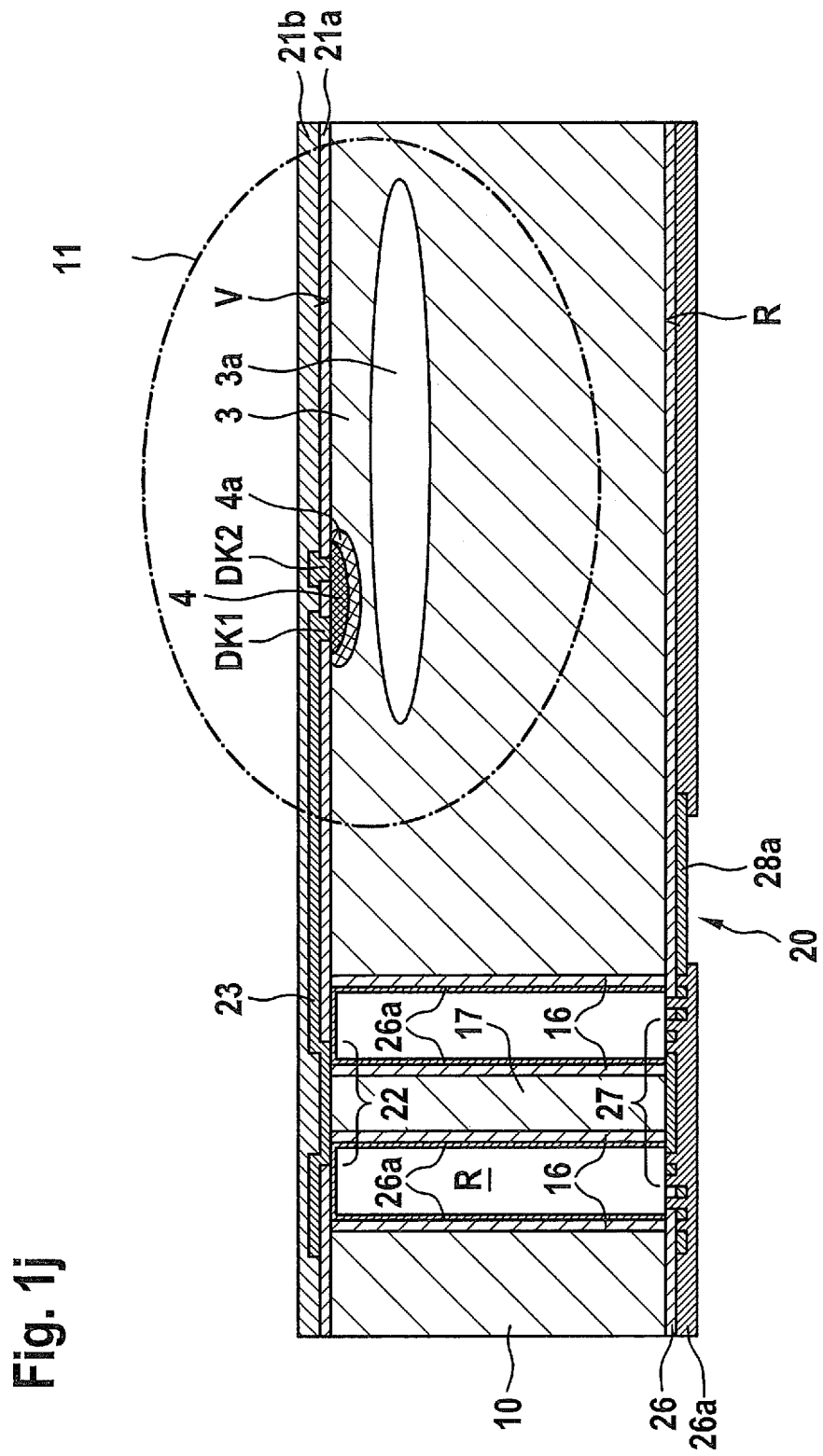

Finally, with reference to FIG. 1j, a contacting hole 20 is formed in insulating layer 26a in order to expose in this area printed conductor 28 on the back side, thus making a subsequent electrical contacting (not shown) of printed conductor 28 possible.

Optionally, the electrical contact between the different metal layers and silicon substrate 10 may be improved with the aid of a temperature step. This step may be carried out multiple times or even earlier in the process.

On back side R, additional process steps (not illustrated) may finally take place to produce additional components.

The described and illustrated specific embodiment allows a simple production of a low-resistance feedthrough having a high electric strength which is formed using substrate punch 17 coated with the conductive tungsten layer.

The boundary of the electrical connection of coated substrate punch 17 to lower contact area 27 lies completely or partially in the area of annular trench R, whereby it is achieved that the tungsten deposition easily reaches the transition area to the lower metal layer, thus making a very low transfer resistance possible.

The electrical connection of the coated substrate punch to contact area 22 on the front side also lies completely or partially in the area of annular trench R, whereby here, too, the tungsten deposition reaches the transition area to the upper metal layer, thus making a very low transfer resistance possible.

It is advantageous to use aluminum as the material for printed conductors 23 and 28 and to carry out a temperature step above 350° C. prior to the tungsten deposition, thus achieving a dissolution of aluminum in silicon. In particular, an aluminum layer may optionally be used which has a low silicon content or none at all to achieve the creation of a strong and deep alloy phase between aluminum and silicon during the temperature step. In this way, a low-resistance direct contact is made possible between the alloy phase and tungsten layer 16 following the tungsten reaction.

Figure 2:
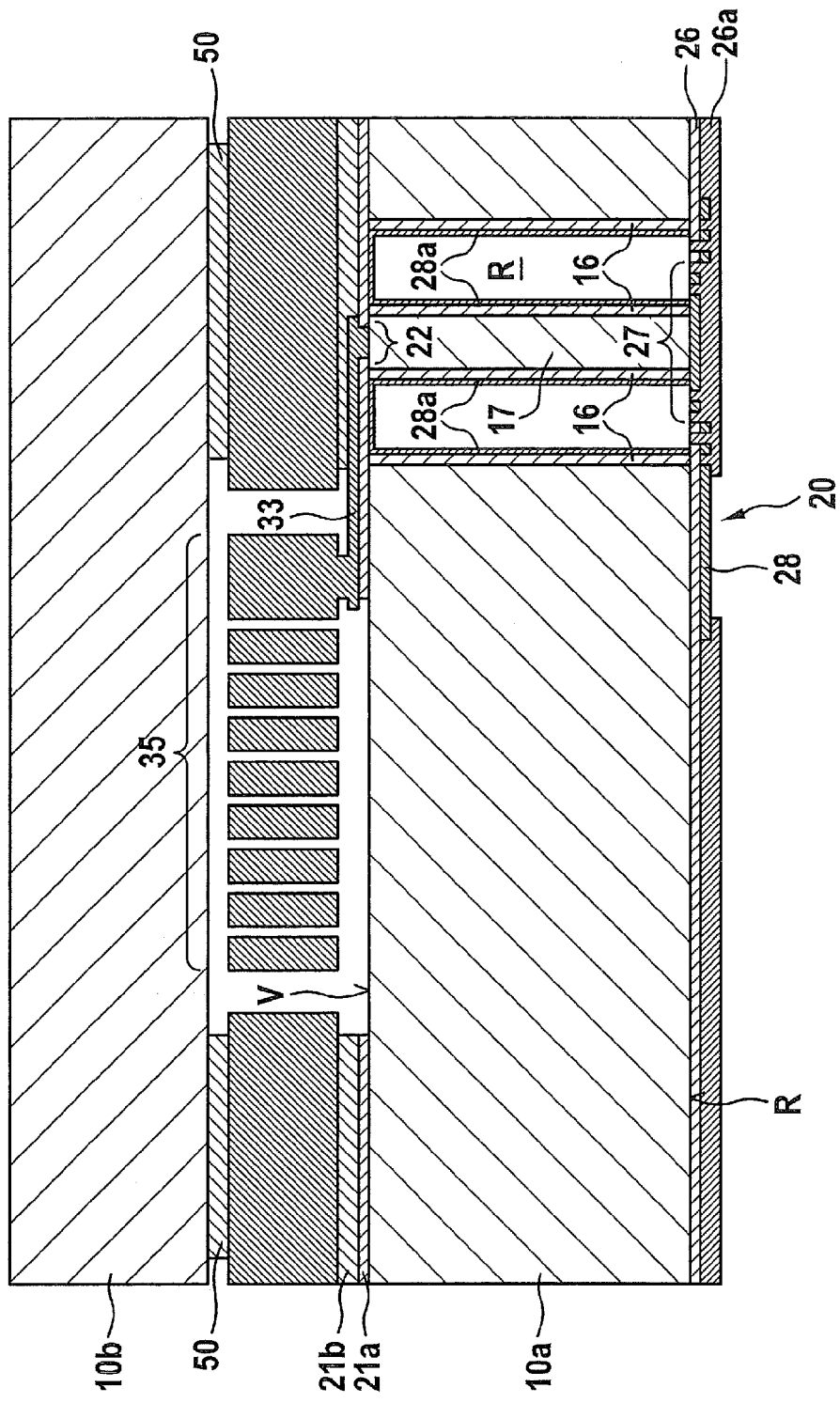
FIG. 2 shows a schematic cross-sectional illustration for explaining an electrical feedthrough in a substrate according to a second specific embodiment of the present invention.

FIG. 2 shows a schematic cross-sectional illustration for explaining an electrical feedthrough in a substrate according to a second specific embodiment of the present invention.

In the specific embodiment illustrated in FIG. 2, the feedthrough described with reference to FIGS. 1a through 1j is applied to a micromechanical sensor component 35 having a movable structure. The feedthrough is located in a first substrate 10a on which sensor structure 35 is provided on front side V. Sensor structure 35 is capped using a cap wafer 10b which is glued on via an adhesive layer 50. A printed conductor 33 of sensor structure 35 is connected to a contact area 22 on front side V which is electrically connected to contact area 27 on the back side via coated substrate punch 17.

The feedthrough is produced using substrate punch 17 coated with tungsten layer 16 similarly to the specific embodiment according to FIGS. 1a through 1j, it being advantageous to initially produce sensor structure 35 on the front side and to cap it with cap wafer 10b for protection, in order to subsequently carry out the described trenching and deposition process to produce the feedthrough.

Although the present invention has been described with reference to multiple exemplary embodiments which may be arbitrarily combined with one another, the present invention is not limited thereto, and may be further modified in various ways.

In particular, the above-mentioned materials are only examples, and are not to be construed as being limiting. In addition, the micromechanical components such as the pressure sensor, the printed conductors, and further electrical components, for example, may be produced in or on the substrate, either before or after producing the feedthroughs.

Of course, any arbitrary additional protective, insulating, passivation, and diffusion barrier layers may be deposited to further increase the reliability.

The method according to the present invention is not limited to the described micromechanical components but is applicable, in principle, to any electrical circuit configurations which require a low-resistance feedthrough of high electric strength.

Also, the present invention is not limited to the described materials but is applicable to any material combinations made of conductive and non-conductive materials.

What is claimed is:

1. A method for producing an electrical feedthrough, comprising:
    forming, on a first side of a substrate, a first printed conductor which electrically connects a first contact area of the substrate on the first side;
    forming, on a second side of a substrate, a second printed conductor which electrically connects a second contact area of the substrate on the second side;
    forming an annular trench in the substrate, a substrate punch being formed which extends from the first contact area to the second contact area; and
    selectively depositing an electrically conductive layer on an inner surface of the annular trench, the substrate punch being coated with the electrically conductive layer and remaining electrically insulated from the surrounding substrate by to the annular trench.

2. The method as recited in claim 1, wherein:
    a lattice is formed on the edge of the second contact area; and
    the annular trench is formed using an etching process during which an etching medium is guided through the lattice to the substrate.

3. The method as recited in claim 2, wherein during the etching process, the first printed conductor and a surrounding insulating layer act as an etch stop.

4. The method as recited in claim 2, wherein the electrically conductive layer is a tungsten layer.

5. The method as recited in claim 2, wherein after the selective deposition of the electrically conductive layer, the lattice is closed by deposition of another insulating layer.

6. The method as recited in claim 2, wherein the first printed conductor is connected to a micromechanical circuit configuration.

7. The method as recited in claim 2, wherein heating above 350° C. is carried out after the deposition of the electrically conductive layer.

8. The method as recited in claim 2, wherein the second side of the substrate is thinned prior to the formation of the annular trench.

9. A substrate having an electrical feedthrough, comprising:
    a first printed conductor on a first side of the substrate, wherein the first conductor electrically connects a first contact area of the substrate on the first side;
    a second printed conductor on a second side of the substrate, wherein the second conductor electrically connects a second contact area of the substrate on the second side;
    an annular trench in the substrate, whereby a substrate punch is formed which extends from the first contact area to the second contact area; and
    an electrically conductive layer on an inner surface of the annular trench, whereby the substrate punch is coated with the electrically conductive layer, the coated substrate punch being electrically insulated from the surrounding substrate by the annular trench.

10. The substrate as recited in claim 9, wherein the electrically conductive layer is a tungsten layer.

11. The substrate as recited in claim 9, wherein the first printed conductor is connected to a micromechanical circuit configuration.

12. The substrate as recited in claim 11, wherein the micromechanical circuit configuration has a sensor structure.

\* \* \* \* \*